United States Patent
Nishikawa et al.

(10) Patent No.: US 8,724,334 B2
(45) Date of Patent: May 13, 2014

(54) CIRCUIT MODULE AND MANUFACTURING METHOD FOR THE SAME

(75) Inventors: Hiroshi Nishikawa, Omihachiman (JP); Makoto Fujita, Kusatsu (JP); Fumikiyo Kawahara, Ibaraki (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 13/547,085

(22) Filed: Jul. 12, 2012

(65) Prior Publication Data

US 2012/0281370 A1 Nov. 8, 2012

Related U.S. Application Data

(60) Division of application No. 13/005,018, filed on Jan. 12, 2011, now Pat. No. 8,240,035, which is a continuation of application No. PCT/JP2009/061112, filed on Aug. 10, 2009.

(30) Foreign Application Priority Data

Aug. 19, 2008 (JP) ................................. 2008-210999

(51) Int. Cl.
*H05K 7/00* (2006.01)
(52) U.S. Cl.
USPC ...... 361/748; 361/818; 361/816; 361/679.01; 361/600; 29/841; 29/832; 29/829; 29/825; 29/412
(58) Field of Classification Search
USPC ........ 29/841, 832, 829, 825, 592.1, 412, 416; 361/748, 818, 816, 679.01, 600
See application file for complete search history.

(56) References Cited

U.S. PATENT DOCUMENTS

| | | | |
|---|---|---|---|
| 6,359,341 B1 | 3/2002 | Huang et al. | |
| 6,838,748 B2 | 1/2005 | Ishio et al. | |
| 2001/0033478 A1* | 10/2001 | Ortiz et al. | 361/818 |
| 2004/0136123 A1 | 7/2004 | Nakamura et al. | |
| 2006/0254808 A1* | 11/2006 | Farnworth et al. | 174/250 |
| 2009/0184403 A1 | 7/2009 | Wang et al. | |

FOREIGN PATENT DOCUMENTS

| | | | |
|---|---|---|---|
| CN | 1442033 A | | 9/2003 |
| CN | 1497717 A | | 5/2004 |
| CN | 1755929 A | | 4/2006 |
| JP | 2008042152 A | * | 2/2008 |
| JP | 4076062 B2 | | 4/2008 |
| TW | 410446 B | | 11/2000 |

OTHER PUBLICATIONS

Nishikawa et al.; "Circuit Module and Manufacturing Method for the Same"; U.S. Appl. No. 13/005,018, filed Jan. 12, 2011.

* cited by examiner

*Primary Examiner* — Peter DungBa Vo
*Assistant Examiner* — Azm Parvez
(74) *Attorney, Agent, or Firm* — Keating & Bennett, LLP

(57) ABSTRACT

A circuit module and a manufacturing method for the same, reduce a possibility that a defect area where an electrically conductive resin is not coated may occur in a shield layer. A mother board is prepared. A plurality of electronic components are mounted on a principal surface of the mother board. An insulator layer is arranged so as to cover the principal surface of the mother board and the electronic components. The insulator layer is cut such that grooves and projections are formed in and on the principal surface of the insulator layer and the insulator layer has a predetermined thickness H. An electrically conductive resin is coated on the principal surface of the insulator layer to form a shield layer. The mother board including the insulator layer and the shield layer both formed thereon is divided to obtain a plurality of circuit modules.

4 Claims, 12 Drawing Sheets

CIRCUIT MODULE AND MANUFACTURING METHOD FOR THE SAME

BACKGROUND OF THE INVENTION

1. Field of the Invention

The present invention relates to a circuit module and a manufacturing method for the same. More specifically, the present invention relates to a circuit module including electronic components mounted on a board, and a manufacturing method for the circular module.

2. Description of the Related Art

As an invention related to a prior-art circuit module and a manufacturing method for the same, there are known a circuit module and a manufacturing method for the same, which are disclosed in Japanese Unexamined Patent Application Publication No. 2008-42152. The manufacturing method for the circuit module, disclosed in Japanese Unexamined Patent Application Publication No. 2008-42152, will be described below with reference to the drawings. FIGS. 14A-14E are sectional views illustrating the manufacturing method for a circuit module 500, which is disclosed in Japanese Unexamined Patent Application Publication No. 2008-42152.

First, as illustrated in FIG. 14A, electronic components 504 are mounted on a board 502. Next, as illustrated in FIG. 14B, an insulating layer 506 is formed so as to cover a principal surface of the board 502 and the electronic components 504. Next, as illustrated in FIG. 14C, cut grooves 508 are formed. On that occasion, at the bottom of each of the cut grooves 508, a tip 508a is formed as a groove having a narrower width than that of the cut groove 508. Next, as illustrated in FIG. 14D, a shield layer 510 is formed by applying an electrically conductive resin to both the insulating layer 506 and the cut grooves 508. Finally, the board 502 and the shield layer 510 are cut by a dicing machine at a cutting width W that is larger than a width of the tip 508a. Consequently, as illustrated in FIG. 14E, the board in the collective (multi-module) form is divided into the individual circuit modules 500.

According to the above-described manufacturing method for the circuit module 500, when the shield layer 510 is formed, air in the cut grooves 508 is caused to reside in the tips 508a. Because the tips 508a are cut away when the multi-module board is divided into the individual circuit modules 500, a possibility that air may remain between the shield layer 510 and each of the board 502 and the insulating layer 506. As a result, adhesion of the shield layer 510 to the board 502 and the insulating layer 506 is increased.

However, the principal surface of the insulating layer 506, on which the shield layer 510 is formed, is flat as illustrated in FIGS. 14A-14E. When the electrically conductive resin in a paste-like state is applied onto the flat insulating layer 506, the applied resin tends to spread overly and to become too thin. Therefore, the manufacturing method for the circuit module 500 accompanies with a risk that a defect area where the electrically conductive resin is not coated may occur in the shield layer 510.

SUMMARY OF THE INVENTION

Preferred embodiments of the present invention provide a circuit module and a manufacturing method for the same, which reduces a possibility that a defect area where an electrically conductive resin is not coated may occur in a shield layer.

A manufacturing method for a circuit module, according to a first preferred embodiment of the present invention, includes the steps of preparing a mother board, mounting a plurality of electronic components on a principal surface of the mother board, forming an insulator layer to cover the principal surface of the mother board and the plurality of electronic components, cutting the insulator layer such that unevenness is created in a principal surface of the insulator layer and the insulator layer has a predetermined thickness, coating an electrically conductive resin on the principal surface of the insulator layer to form a shield layer, and dividing the mother board on which the insulator layer and the shield layer are formed, to thereby obtain a plurality of circuit modules.

A circuit module according to a second preferred embodiment of the present invention includes a board, a plurality of electronic components mounted on a principal surface of the board, an insulator layer covering the principal surface of the board and the electronic components, the insulator layer having unevenness in a principal surface thereof, and a shield layer disposed on the principal surface of the insulator layer and made of an electrically conductive resin.

Preferred embodiments of the present invention reduce the possibility that a defect area where the electrically conductive resin is not coated may occur in the shield layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A circuit module and a manufacturing method for the same, according to preferred embodiments of the present invention, will be described with reference to the drawings.

Figure 1:
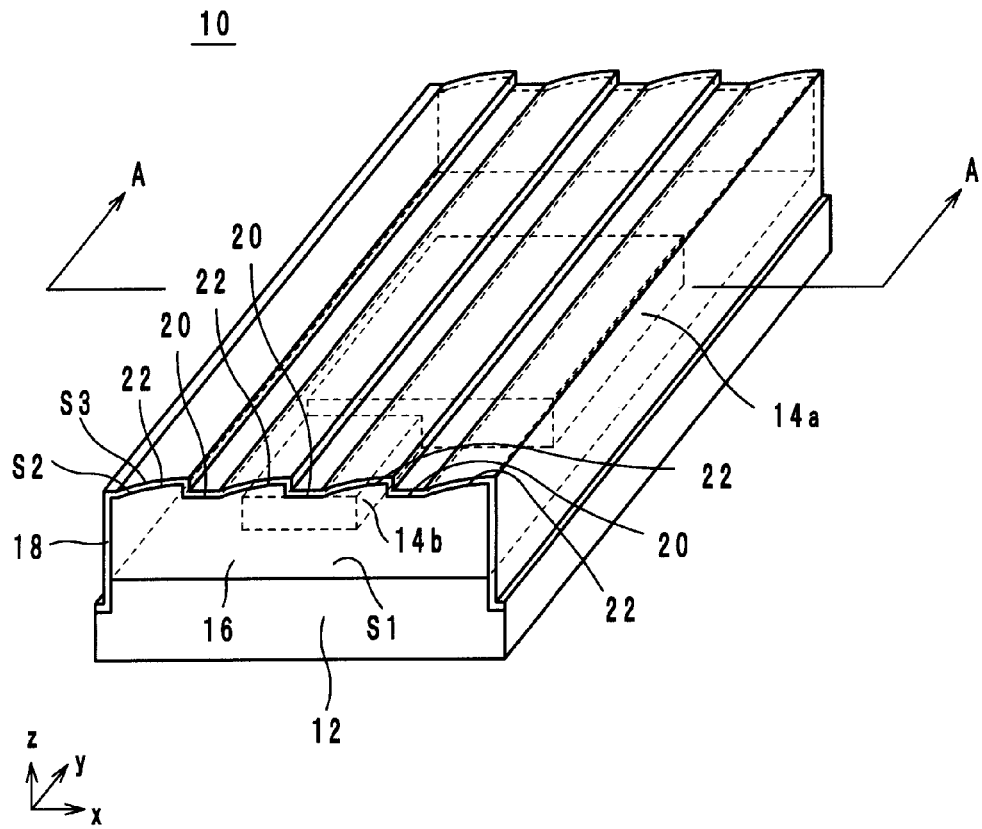
FIG. 1 is a perspective view illustrating an outer appearance of a circuit module according to one preferred embodiment of the present invention.
Figure 2:
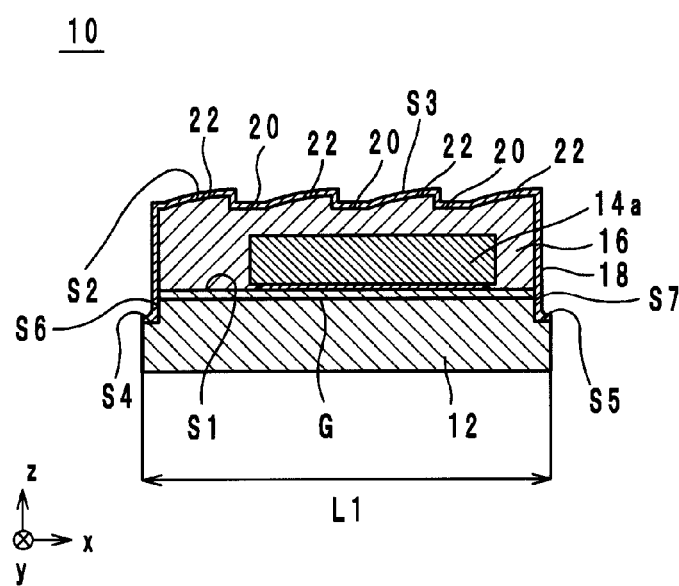
FIG. 2 is a sectional view, taking along A-A, illustrating the structure of the circuit module of FIG. 1.

A construction of the circuit module according to one preferred embodiment of the present invention will be described below with reference to the drawings. FIG. 1 is a perspective view illustrating an outer appearance of a circuit module 10 according to one preferred embodiment of the present invention. FIG. 1 is illustrated in a partially see-through way for understanding of an inner structure of the circuit module 10. FIG. 2 is a sectional view, taking along A-A, illustrating the structure of the circuit module 10 of FIG. 1. In the following description, a direction of height of the circuit module 10 having a substantially rectangular parallelepiped shape is defined as a z-axis direction. Further, a direction in which a short side of the circuit module extends when viewed from above in the z-axis direction is defined as an x-axis direction, and a direction in which a long side of the circuit module extends is defined as a y-axis direction. The x-axis, the y-axis, and the z-axis are orthogonal to one another.

Figure 3:
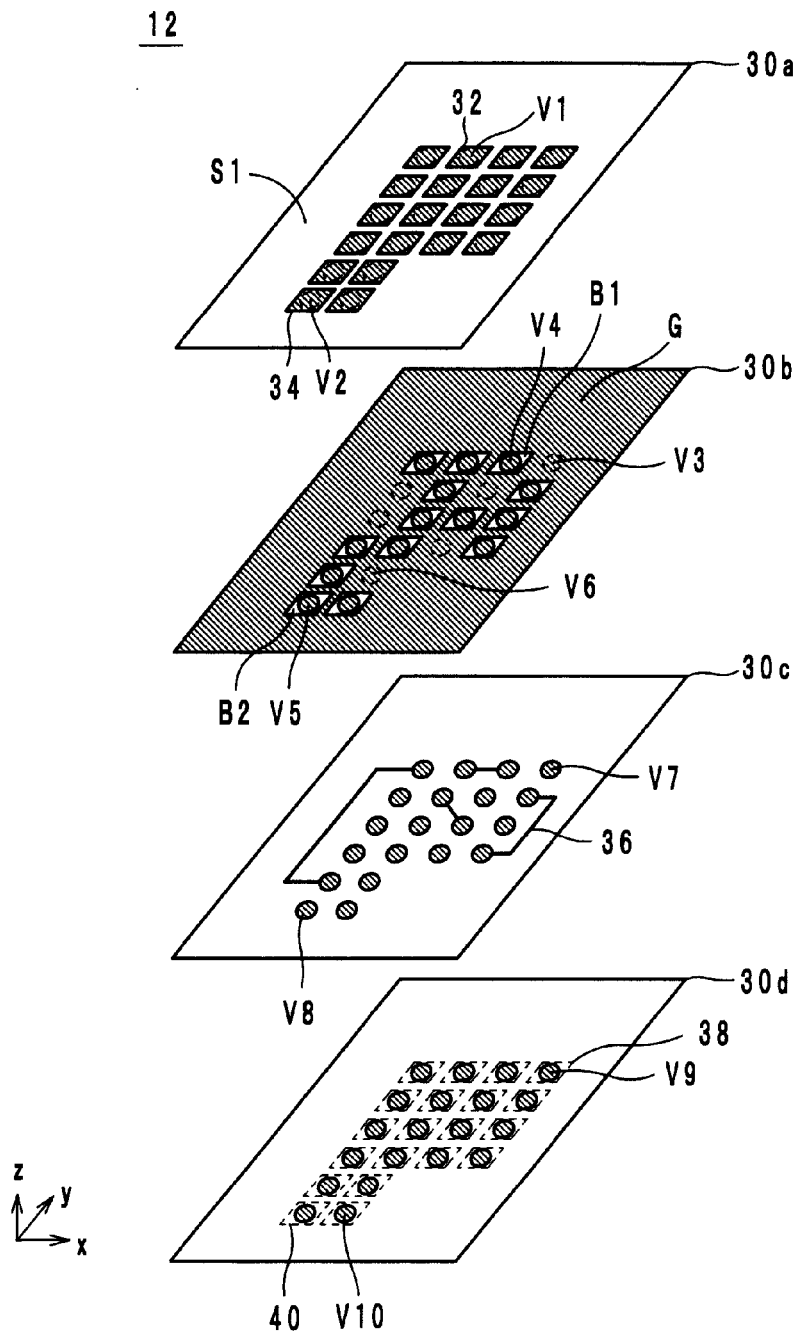
FIG. 3 is an exploded perspective view of a circuit board.

As illustrated in FIG. 1, the circuit module 10 includes a circuit board 12, electronic components 14a and 14b, an insulator layer 16, and a shield layer 18. The circuit board is a printed board including built-in circuits and having external electrodes. The construction of the circuit board 12 will be described below with reference to FIG. 3. FIG. 3 is an exploded perspective view of the circuit board 12.

The circuit board 12 preferably is the so-called multilayer printed board and includes insulator layers 30a to 30d, external electrodes 32, 34, 38 and 40, wiring 36, via-hole conductors V1 to V10, and a ground conductor G. Also, the circuit board 12 has a principal surface S1 on the positive side in the z-axis direction. In FIG. 3, reference numerals representing the external electrodes 32, 34, 38 and 40, the wiring 36, the via-hole conductors V1 to V10 are attached to only typical ones of the respective components.

Each of the insulator layers 30a to 30d preferably has a rectangular shape and is made of glass epoxy, for example. The insulator layers 30a to 30d may be each made of a ceramic, for example. In the following description, a principal surface of each of the insulator layers 30a to 30d on the positive side in the z-axis direction is called a front surface, and a principal surface of each of the insulator layers 30a to 30d on the negative side in the z-axis direction is called a rear surface.

A plurality of external electrodes 32, for example, sixteen in this preferred embodiment, is provided on the front surface of the insulator layer 30a. The electronic component 14a is mounted to the external electrodes 32. A plurality of external electrodes 34, for example, four in this preferred embodiment, is provided on the front surface of the insulator layer 30a. The electronic component 14b is mounted to the external electrodes 34.

The via-hole conductor V1 is arranged so as to penetrate the insulator layer 30a in the z-axis direction and is connected at its end on the positive side in the z-axis direction to the external electrode 32. The via-hole conductor V2 is arranged so as to penetrate the insulator layer 30a in the z-axis direction and is connected at its end on the positive side in the z-axis direction to the external electrode 34.

The ground conductor G is a conductor layer covering substantially the entire front surface of the insulator layer 30b. Therefore, the ground conductor G is in contact with four sides of the insulator layer 30b, as illustrated in FIG. 3. However, the ground conductor G has blank portions B1 and B2 in which the conductor layer is not provided. The via-hole conductors V4 and V5 are arranged so as to penetrate the insulator layer 30b in the z-axis direction at respective positions aligned with the blank portions B1 and B2 when viewed from above in the z-axis direction. Thus, the via-hole conductors V4 and V5 are insulated from the ground conductor G. Respective ends of the via-hole conductors V4 and V5 on the positive side in the z-axis direction are connected to the via-hole conductors V1 and V2, which are aligned respectively with the via-hole conductors V4 and V5 when viewed from above in the z-axis direction. Further, respective ends of those ones among the via-hole conductors V1 and V2 on the negative direction side except for the other ones among the via-hole conductors V1 and V2, which are connected respectively to the via-hole conductors V4 and V5, are connected to the ground conductor G.

The via-hole conductors V3 and V6 are arranged so as to penetrate the insulator layer 30b in the z-axis direction and are connected at their ends on the positive side in the z-axis direction to the ground conductor G. Further, the via-hole conductors V3 and V6 are disposed at positions aligned respectively with the via-hole conductors V1 and V2 when viewed from above in the z-axis direction.

The via-hole conductor V7 is arranged so as to penetrate the insulator layer 30c in the z-axis direction and is connected at its end on the positive side in the z-axis direction to the via-hole conductor V3 or the via-hole conductor V4. Also, the via-hole conductor V8 is arranged so as to penetrate the insulator layer 30c in the z-axis direction and is connected at its end on the positive side in the z-axis direction to the via-hole conductor V5 or the via-hole conductor V6.

The wiring 36 is disposed on the front surface of the insulator layer 30c for interconnection between the via-hole conductors V7 and between the via-hole conductors V7 and V8.

The via-hole conductor V9 is arranged so as to penetrate the insulator layer 30d in the z-axis direction and is connected at its end on the positive side in the z-axis direction to the via-hole conductor V7. Also, the via-hole conductor V10 is arranged so as to penetrate the insulator layer 30d in the z-axis direction and is connected at its end on the positive side in the z-axis direction to the via-hole conductor V8.

A plurality of external electrodes 38, for example, sixteen in this preferred embodiment, is provided on the rear surface of the insulator layer 30d. An end of the via-hole conductor V9 on the negative side in the z-axis direction is connected to the external electrode 38. A plurality of external electrodes 40, for example, four in this preferred embodiment, is provided on the rear surface of the insulator layer 30d. An end of the via-hole conductor V10 on the negative side in the z-axis direction is connected to the external electrode 40. When the circuit board 12 is mounted to a mother board, the external electrodes 38 and 40 are connected to external electrodes of the mother board. Further, the ground potential is applied to the external electrodes 38 and 40, which are electrically connected to the ground conductor G.

The internal structure of the circuit board 12 is not particularly important except for that the ground conductor G is disposed, and hence a more detailed description thereof is omitted. The circuit board 12 may preferably include, for example, a capacitor, a coil, and a microstrip line.

The electronic component 14a is, e.g., a semiconductor integrated circuit and is mounted on the principal surface S1 of the circuit board 12 as illustrated in FIGS. 1 and 2. A plurality (e.g., 16) of external electrodes (not shown) are disposed on a principal surface of the electronic component 14a on the negative side in the z-axis direction and are connected to the external electrodes 32 illustrated in FIG. 3 by soldering, for example.

The electronic component 14b preferably is, e.g., a chip-type electronic component, such as a noise filter, and is mounted on the principal surface S1 of the circuit board 12 as illustrated in FIGS. 1 and 2. A plurality (e.g., 4) of external electrodes (not shown) are disposed on a principal surface of the electronic component 14b on the negative side in the z-axis direction and are connected to the external electrodes 34 illustrated in FIG. 3 by soldering, for example.

The insulator layer 16 is preferably made of an insulating resin (e.g., an epoxy resin) and covers the principal surface S1 of the circuit board 12 and the electronic components 14a and 14b as illustrated in FIGS. 1 and 2. The insulator layer serves not only to protect the principal surface S1 of the circuit board 12 and the electronic components 14a and 14b, but also to insulate the electronic components 14a and 14b from the shield layer 18 (described later).

Further, unevenness is created in the principal surface S2 of the insulator layer 16 on the positive side in the z-axis direction. More specifically, the unevenness is provided by a plurality of grooves 20 and a plurality of projections 22, which are formed to extend in the y-axis direction. The grooves 20 and the projections 22 are alternately disposed side by side in the x-axis direction. In addition, the plurality of grooves 20 have the same shape in a section perpendicular to the y-axis direction as illustrated in FIG. 2, and the plurality of projections 22 also have the same shape in a section perpendicular to the y-axis direction as illustrated in FIG. 2. The plurality of grooves 20 and the plurality of projections 22 are positioned side by side at equal intervals in the x-axis direction. In other words, the unevenness having a cyclic structure is created in the principal surface S2. Be it noted that, in FIGS. 1 and 2, rugged portions defined by the grooves 20 and the projections 22 are illustrated in a more exaggerated scale than actual for easier understanding of the unevenness.

The shield layer 18 is preferably made of an electrically conductive resin coated on the principal surface S2 of the insulator layer. Because the film thickness of the shield layer 18 is comparatively thin, unevenness is also created in a principal surface of the shield layer 18 in conformity with the unevenness in the principal surface of the insulator layer 16. Further, the shield layer 18 covers lateral surfaces of the insulator layer 16, which are positioned on both sides of the insulator layer 16 in the x-axis direction.

In addition, the shield layer 18 covers respective portions of lateral surfaces of the circuit board 12, which are positioned on both sides of the circuit board 12 in the x-axis direction. More specifically, as illustrated in FIGS. 1 and 2, steps (level differences) are preferably provided at both sides of the principal surface S1 of the circuit board 12 in the x-axis direction. Stated another way, surfaces S4 and S5 positioned at levels shifted toward the more negative side in the z-axis direction than the principal surface S1 and facing the positive side in the z-axis direction are formed, as illustrated in FIG. 2, by cutting away portions of the principal surface S1 on both sides in the x-axis direction. The surface S4 is positioned on the negative side in the x-axis direction, and the surface S5 is positioned on the positive side in the x-axis direction. Further, a surface S6 is arranged so as to interconnect the principal surface S1 and the surface S4, and a surface S7 is arranged so as to interconnect the principal surface S1 and the surface S5. The surfaces S6 and S7 are surfaces extending perpendicular or substantially perpendicular to the x-axis direction. The surface S6 and the lateral surface of the insulator layer 16 on the negative side in the x-axis direction are preferably flush with each other with no step formed between them. Similarly, the surface S7 and the lateral surface of the insulator layer 16 on the positive side in the x-axis direction are preferably flush with each other with no step formed between them.

The ground conductor G is exposed from the surfaces S6 and S7 as illustrated in FIG. 2. The shield layer 18 covers the surfaces S4 to S7. Therefore, the shield layer 18 and the ground conductor G are connected to each other. Thus, the ground potential is applied to the shield layer 18. As a result, the shield layer 18 serves to prevent noise from being radiated to the exterior of the circuit module 10 and noise from coming into the interior of the circuit module 10.

A manufacturing method for the circuit module 10 will be described below with reference to the drawings. FIGS. 4 to 6, 8 and 10 are each a perspective view illustrating an outer appearance of the circuit module 10 during fabrication thereof. FIGS. 7, 9 and 11 are each a sectional view illustrating a manufacturing step for the circuit modules.

Figure 4:
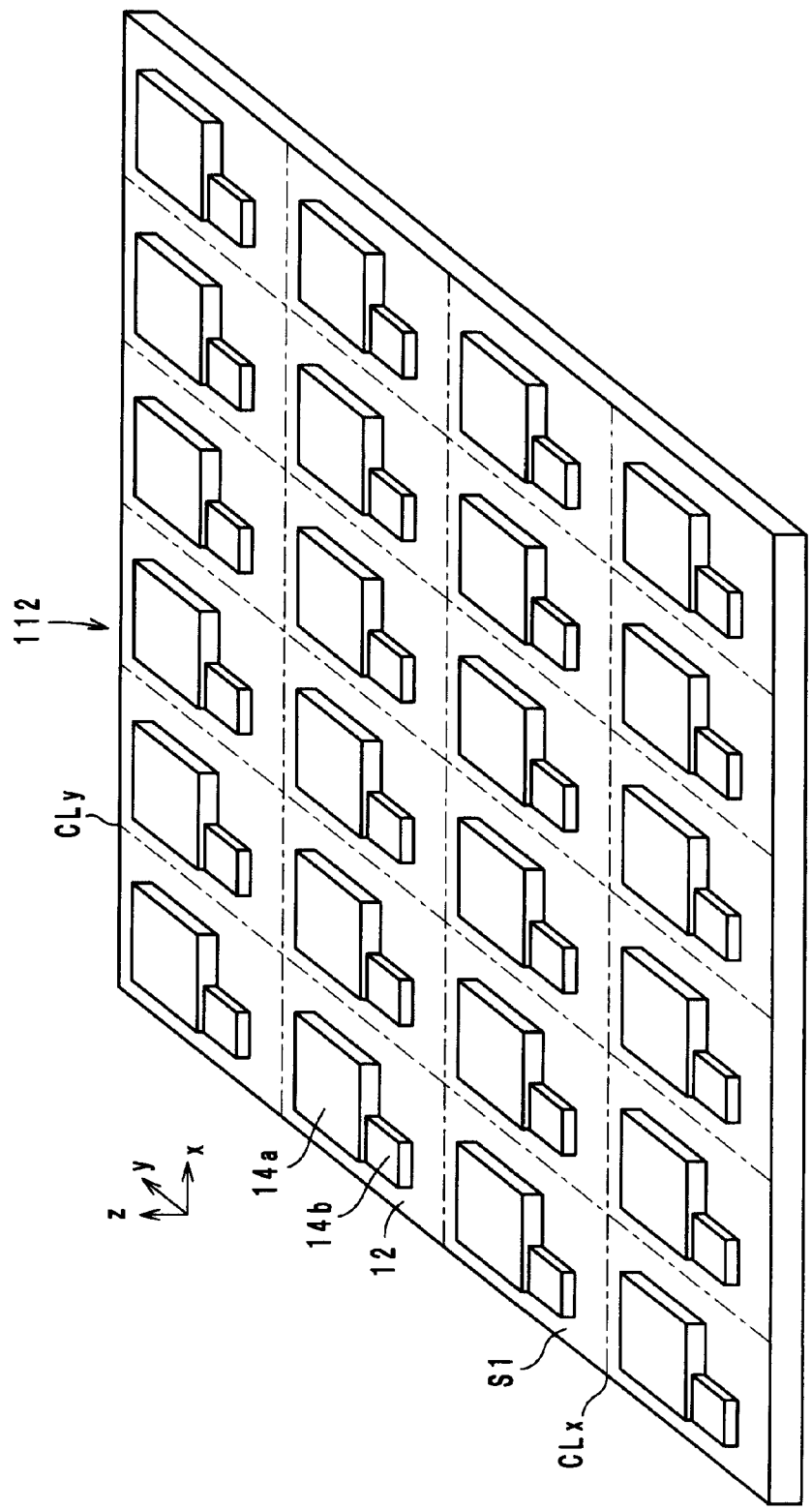
FIG. 4 is a perspective view illustrating an outer appearance of the circuit module during fabrication thereof.

First, a mother board 112 illustrated in FIG. 4 is prepared. The mother board 112 is a collective (multi-module) board including a plurality of circuit boards 12 arrayed in a matrix pattern. In FIG. 4, twenty-four (24) circuit boards 12 are arrayed. The mother board 112 may be prepared by fabricating it or by purchasing a completed product from the market. Because the mother board 112 is a general component, a description of a method of fabricating the mother board 112 is omitted.

Next, as illustrated in FIG. 4, plural sets of electronic components 14a and 14b are mounted onto the principal surface S1 of the mother board 112. More specifically, the mother board 112 is demarcated into the plurality of circuit boards 12 as indicated by one-dot-chain lines. Among the one-dot-chain lines in FIG. 4, the one-dot-chain lines extending in the x-axis direction represent cut lines CLx, and the one-dot-chain lines extending in the y-axis direction represent cut lines CLy. The cut lines CLx and CLy are lines along which the mother board 112 is divided. Further, each set of electronic components 14a and 14b is mounted onto the principal surface S1 of each circuit board 12 in one-to-one relation by soldering.

Figure 5:
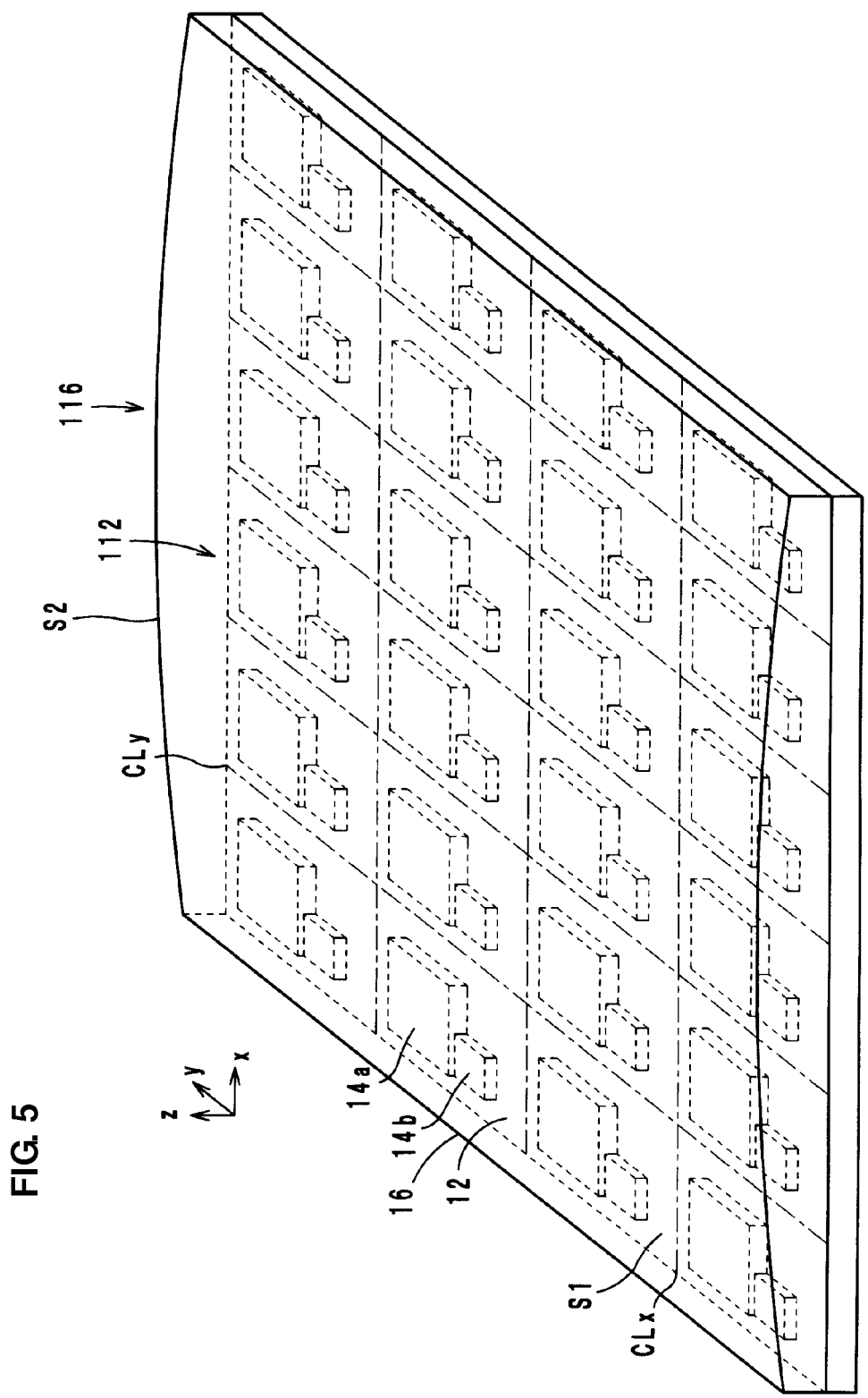
FIG. 5 is a perspective view illustrating an outer appearance of the circuit module during fabrication thereof.

Next, as illustrated in FIG. 5, an insulator layer 116 is formed so as to cover the principal surface S1 of the mother board 112 and the plural sets of electronic components 14a and 14b. More specifically, an insulating resin is coated over the principal surface S1 of the mother board 112 and the plural sets of electronic components 14a and 14b by using a dispenser. Further, the coated insulating resin is heated to be hardened.

Figure 6:
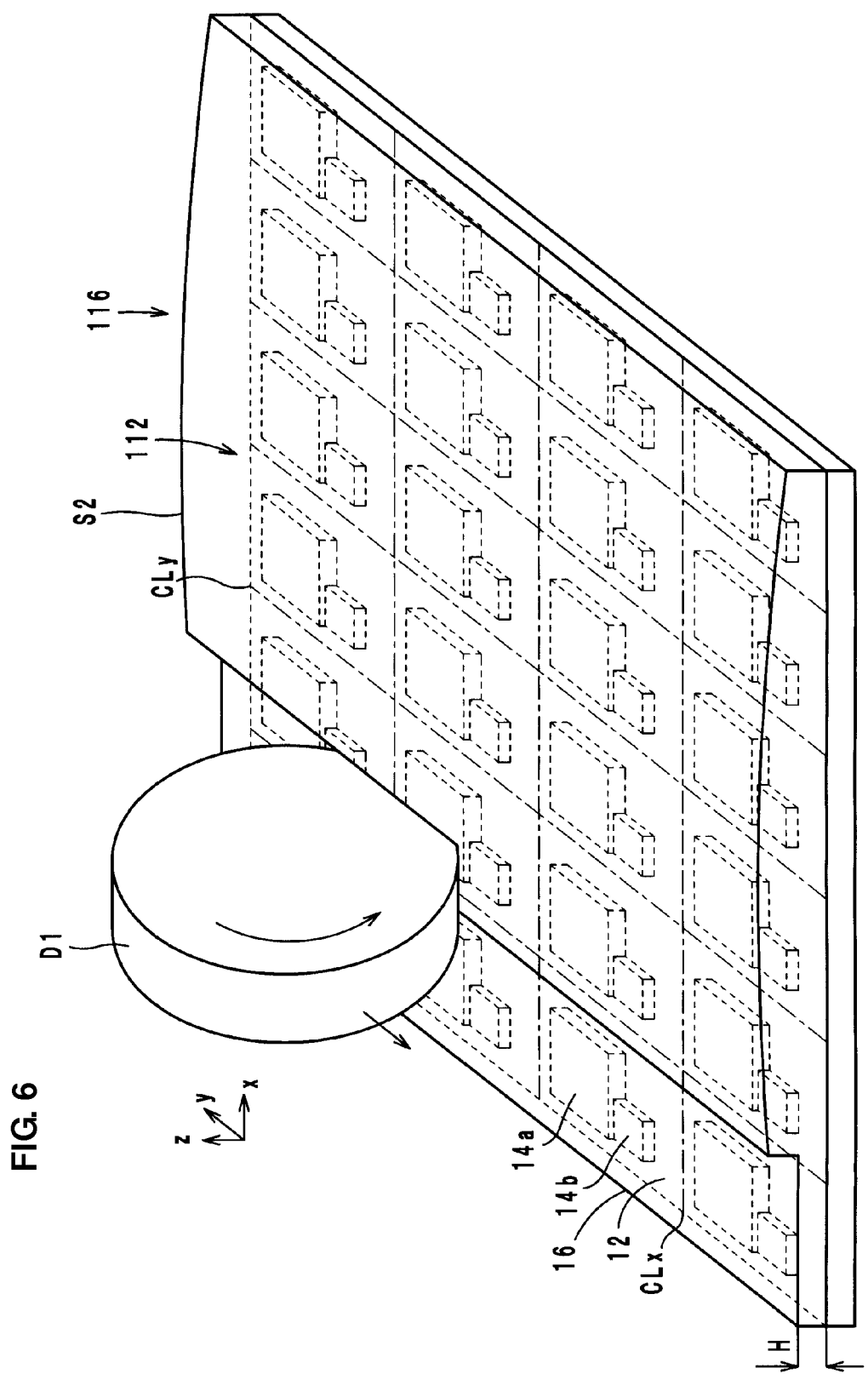
FIG. 6 is a perspective view illustrating an outer appearance of the circuit module during fabrication thereof.
Figure 7:
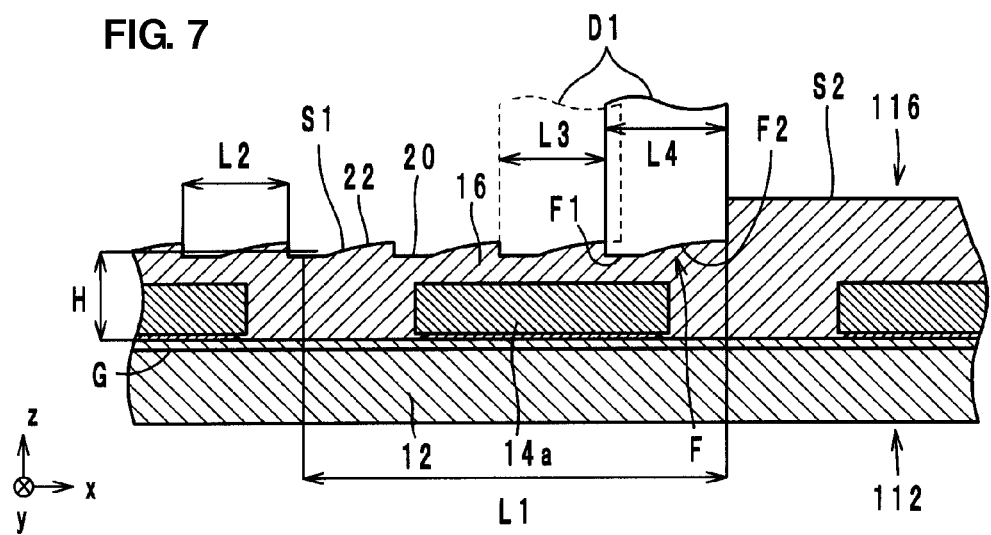
FIG. 7 is a sectional view illustrating a manufacturing step for the circuit module.

Next, as illustrated in FIGS. 6 and 7, the insulator layer 116 is cut such that unevenness is created in the principal surface S2 of the insulator layer 116 and that the insulator layer 116 has a predetermined thickness H. In this preferred embodiment, as illustrated in FIG. 7, a plurality of grooves 20 and a plurality of projections 22, the grooves 20 and the projections 22 extending in the y-axis direction, are formed in and on the principal surface S2 of the insulator layer 116. Further, as illustrated in FIG. 7, an interval L2 at which the plurality of grooves 20 are formed or an interval L2 at which the plurality of projections 22 are formed is smaller than a width L1 of the circuit module 10 as viewed in the x-axis direction.

A process of cutting the insulator layer 116 will be described in more detail. In the process of cutting the insulator layer 116, as illustrated in FIG. 6, a dicer D1 is moved over the principal surface S2 of the insulator layer 116 toward the negative side in the y-axis direction. Thereafter, the dicer D1 is shifted toward the positive side in the x-axis direction. The dicer D1 is then moved over the principal surface S2 of the insulator layer 116 toward the negative side in the y-axis direction. The entire principal surface S2 of the insulator layer 116 is cut by repeating those steps.

A cutting surface F of the dicer D1 has unevenness as illustrated in FIG. 7. More specifically, the cutting surface F includes a projected portion F1 and a recessed portion F2. The projected portion F1 is relatively projected toward the negative side in the z-axis direction, and the recessed portion F2 is relatively recessed toward the positive side in the z-axis direction. Further, the recessed portion F2 is positioned on the more positive side in the x-axis direction than the projected portion F1. The reason why the cutting surface F of the dicer D1 has such a structure is as follows.

The cutting surface F of the dicer D1 is flat in a new state. As described above, however, the dicer D1 is moved toward the negative side in the y-axis direction and then shifted toward the positive side in the x-axis direction step by step. Accordingly, when the dicer D1 initially cuts the insulator layer 116, it contacts a side of the principal surface S2 of the insulator layer 116 on the negative side in the x-axis direction. At that time, the dicer D1 contacts the insulator layer 116 at the recessed portion F2, which is positioned on the more positive side in the x-axis direction than the projected portion F1, instead of contacting the insulator layer 116 at the entire cutting surface F. Hence, the recessed portion F2 tends to wear faster than the projected portion F1. As a result, the cutting surface F is caused to have the projected portion F1 and the recessed portion F2 with the lapse of time, as illustrated in FIG. 7.

When the insulator layer 116 is cut by using the dicer D1 having the above-described cutting surface F, the insulator layer 116 is cut in a relatively large amount by the projected portion F1 such that the groove 20 is formed. Also, the insulator layer 116 is cut in a relatively small amount by the recessed portion F2 such that the projection 22 is formed.

Further, as illustrated in FIG. 7, a width L4 of the dicer D1 in the x-axis direction preferably is smaller than the width L1 of the circuit module 10 in the x-axis direction. Therefore, the plurality of grooves 20 and the plurality of projections 22 are preferably formed to have a cyclic structure with respect to one circuit module 10. In addition, as illustrated in FIG. 7, a width L3 by which the dicer D1 is shifted toward the positive side in the x-axis direction is smaller than the width L4 of the dicer D1 in the x-axis direction. With such a structure, one region where the dicer D1 is moved in each stroke of cutting over the principal surface S2 of the insulator layer 116 overlaps with an adjacent similar region. Consequently, it is possible to prevent some area of the insulator layer 116 from remaining uncut.

In FIG. 7, a thickness H of the insulator layer 116 is provided as an average value of the distance from the principal surface S1 of the mother board 112 to the principal surface S2 of the insulator layer 116.

Figure 8:
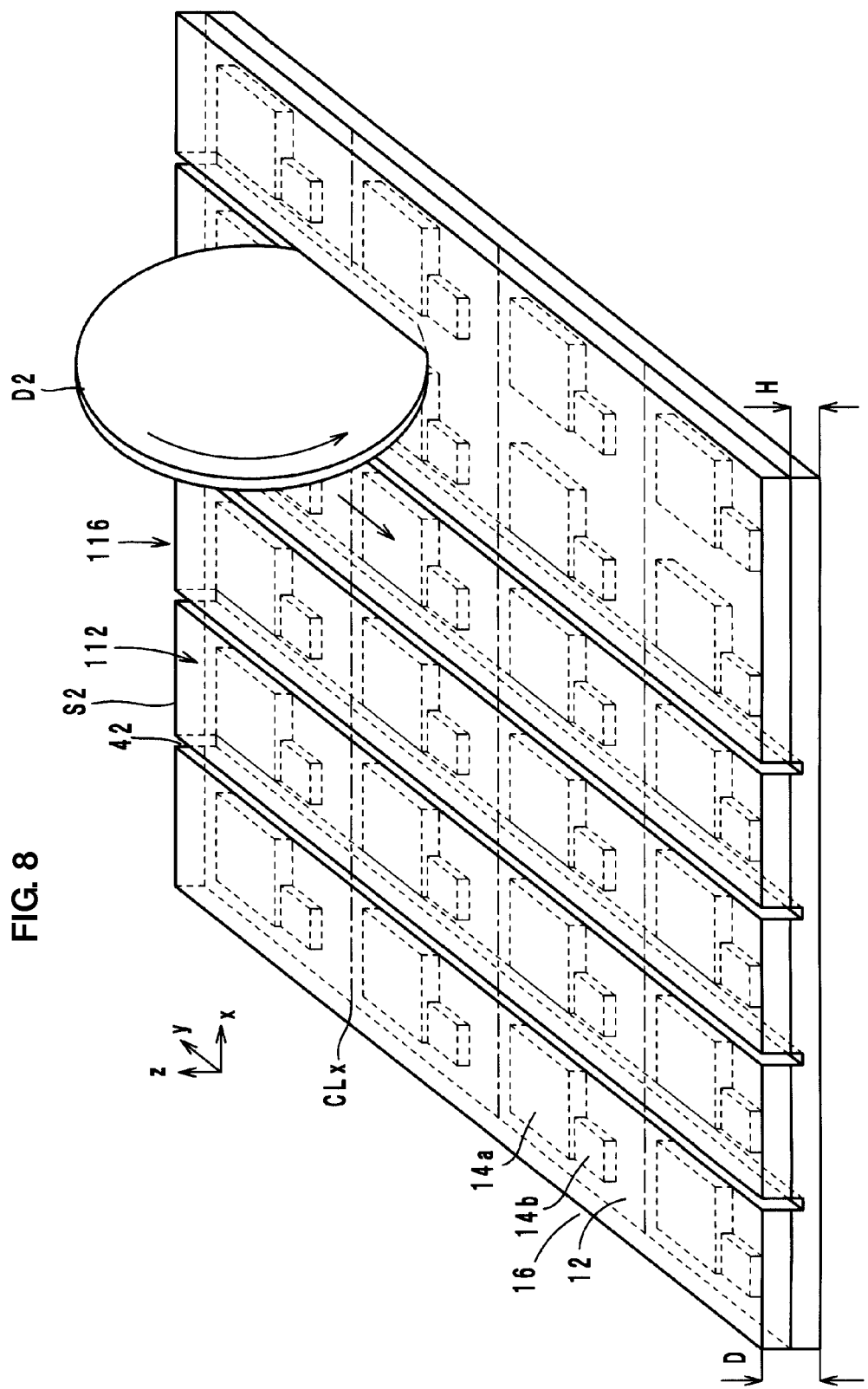
FIG. 8 is a perspective view illustrating an outer appearance of the circuit module during fabrication thereof.
Figure 9:
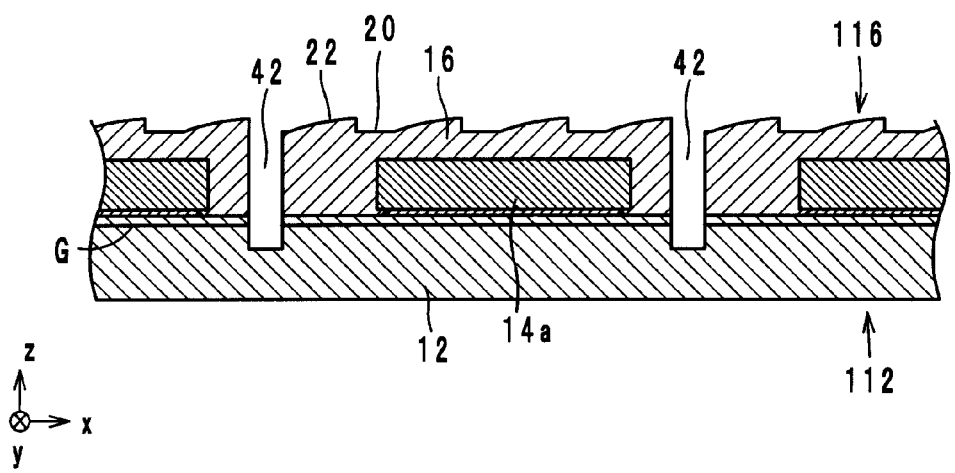
FIG. 9 is a sectional view illustrating a manufacturing step for the circuit module.

Next, as illustrated in FIG. 8, a plurality of grooves 42 extending in the y-axis direction are formed by using a dicer D2 which has a narrower width than the dicer D1. More specifically, the dicer D2 is advanced toward the negative side in the y-axis direction along the cut line CLy illustrated in FIG. 6. At that time, as illustrated in FIG. 9, the grooves 42 are each formed such that a bottom surface of the groove 42 does not reach the principal surface of the mother board 112 on the negative side in the z-axis direction, but it reaches a position on the more negative side in the z-axis direction than the ground conductor G. Thus, the ground conductor G is exposed at inner peripheral surfaces of each groove 42.

Figure 10:
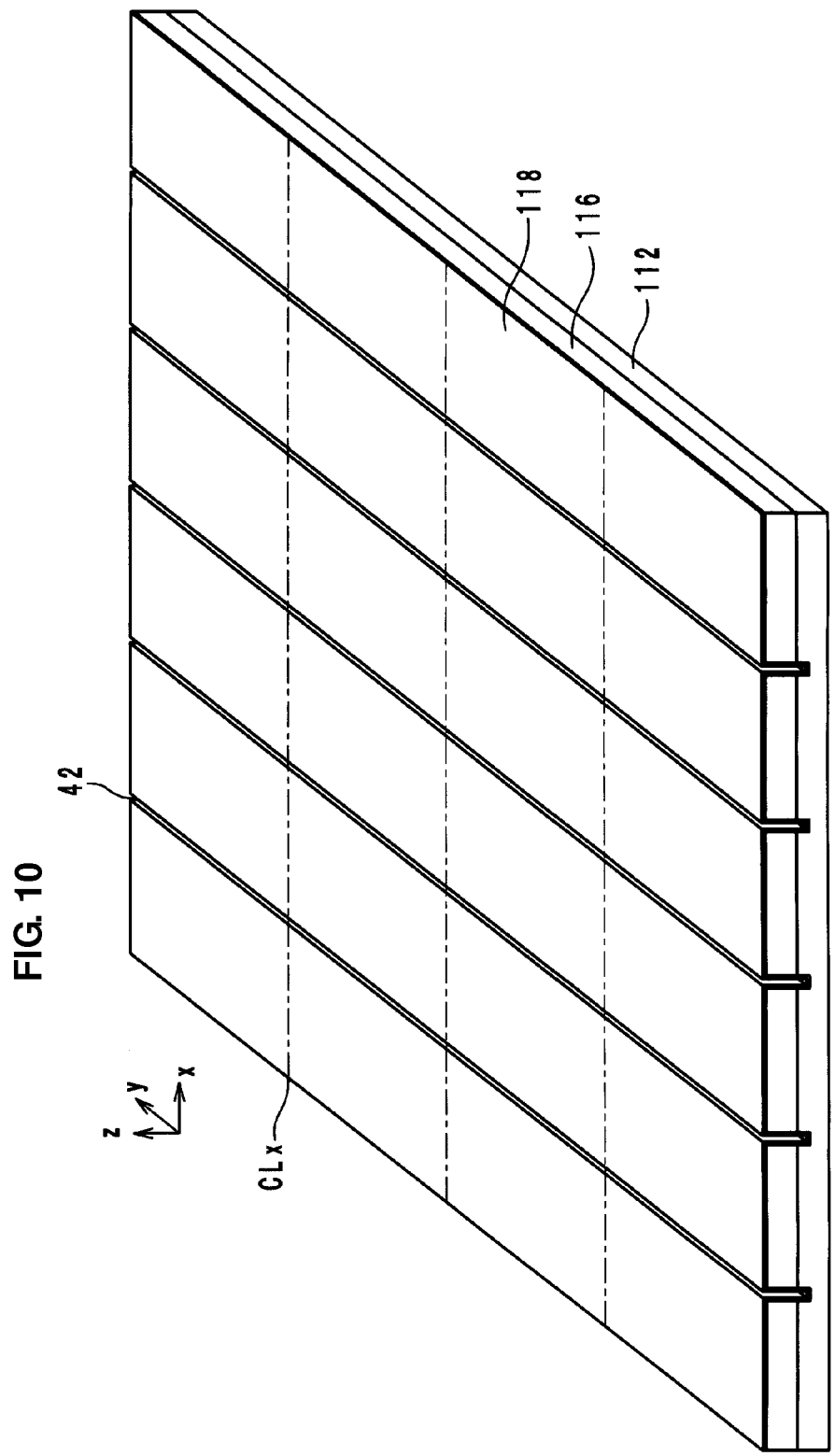
FIG. 10 is a perspective view illustrating an outer appearance of the circuit module during fabrication thereof.
Figure 11:
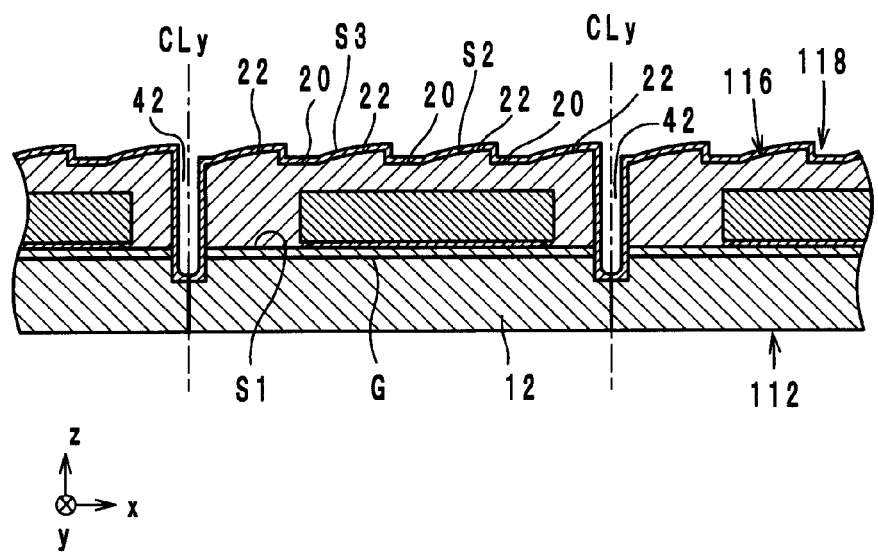
FIG. 11 is a sectional view illustrating a manufacturing step for the circuit module.

Next, as illustrated in FIGS. 10 and 11, a shield layer 118 is formed by coating an electrically conductive resin on the principal surface S2 of the insulator layer 116 and the inner peripheral surfaces of the grooves 42. The electrically conductive resin is preferably coated by the spin coating method, for example. More specifically, the mother board 112 is preferably placed on a rotary table and is rotated at a predetermined angular speed. Then, the electrically conductive resin in a slurry-like state is dripped onto a center of the insulator layer 116. The dripped electrically conductive resin is caused to thinly spread over the entire principal surface S2 of the insulator layer 116 by the action of a centrifugal force. On that occasion, the electrically conductive resin gradually spreads over the entire principal surface S2 of the insulator layer 116 while repeating such a behavior that the resin enters the grooves 20 to stay therein and hits against the projections 22. As a result, the electrically conductive resin is kept from extending too thinly and a defect area where the electrically conductive resin is not coated is prevented from generating in the shield layer 118. Thereafter, the shield layer 118 is hardened. Additionally, unevenness in conformity with the unevenness in the principal surface S2 is created in a principal surface S3 of the shield layer 118.

Next, the mother board 112 including the insulator layer 116 and the shield layer 118 formed thereon is divided into the plurality of circuit modules 10. More specifically, a dicer having a narrower width than the dicer D2 is advanced along the cut lines CLx and CLy to cut the mother board 112. The circuit module 10, illustrated in FIGS. 1 and 2, is completed through the above-described process.

The above-described circuit module 10 and manufacturing method for the same can reduce a possibility that the defect area where the electrically conductive resin is not coated may occur in the shield layer 18. Such an advantage is described in more detail. According to the manufacturing method for the circuit module 500 which is disclosed in Japanese Unexamined Patent Application Publication No. 2008-42152, as illustrated in FIGS. 14A-14E, the principal surface of the insulating layer 506 on which the shield layer 510 is formed is flat. When the electrically conductive resin in the paste-like state is coated on the flat principal surface of the insulating layer 5006, the resin tends to extend too thinly. Consequently, the manufacturing method for the circuit module 500 has a risk that the defect area where the electrically conductive resin is not coated may occur in the shield layer 510.

On the other hand, according to the circuit module 10 and the manufacturing method for the same, the unevenness (in the form of the grooves 20 and the projections 22) is created in the principal surface S2 of the insulator layer 116. Therefore, when the electrically conductive resin is coated on the principal surface S2 of the insulator layer 116 by the spin coating method, for example, the electrically conductive resin is caused to spread over the entire principal surface S2 while moving up and down following the unevenness. Hence, the electrically conductive resin can be kept from extending too thinly and the defect area where the electrically conductive resin is not coated can be prevented from generating in the shield layer 118.

Also, the circuit module 10 and the manufacturing method for the same can prevent the generation of the defect area for the following reason as well. More specifically, if the interval at which the grooves 20 and the projections 22 are formed is too wide, there is a risk that the electrically conductive resin may extend too thinly. To cope with the risk, according to the circuit module 10 and the manufacturing method for the same, the width L4 of the dicer D1 in the x-axis direction is set smaller than the width L1 of the circuit module 10 in the x-axis direction, as illustrated in FIG. 7. Further, the width L3 by which the dicer D1 is shifted in the x-axis direction is smaller than the width L4 of the dicer D1 in the x-axis direction. With such a structure, the plurality of grooves 20 and the plurality of projections 22 are formed with respect to one circuit board 12. As a result, the interval at which the grooves 20 and the projections 22 are formed is kept from becoming too wide, whereby the electrically conductive resin is prevented from extending too thinly and the generation of the defect area is reduced.

Moreover, the circuit module 10 and the manufacturing method for the same can prevent the occurrence of a break in wires between the electronic components 14a, 14b and the circuit board 12 for the reason described below. More specifically, according to the circuit module 10 and the manufacturing method for the same, the width L4 of the dicer D1 in the x-axis direction is set smaller than the width L1 of the circuit module 10 in the x-axis direction. By cutting the insulator layer 116 with the dicer D1 having the comparatively narrow width, an amount by which the insulator layer 116 is cut per unit time is reduced. This means that a load imposed on the mother board 12 during the cutting of the insulator layer 116 is comparatively small. It is hence possible to avoid an excessive load from being imposed on the mother board 112 during the cutting of the insulator layer 116, and to suppress the occurrence of a break in wires between the mother board 112 and the electronic components 14a, 14b.

Figure 12:
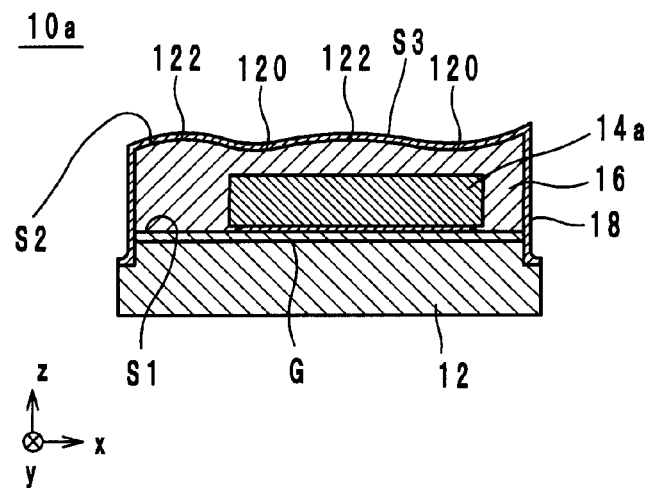
FIG. 12 is a sectional view illustrating the structure of a circuit module according to a modification.
Figure 13:
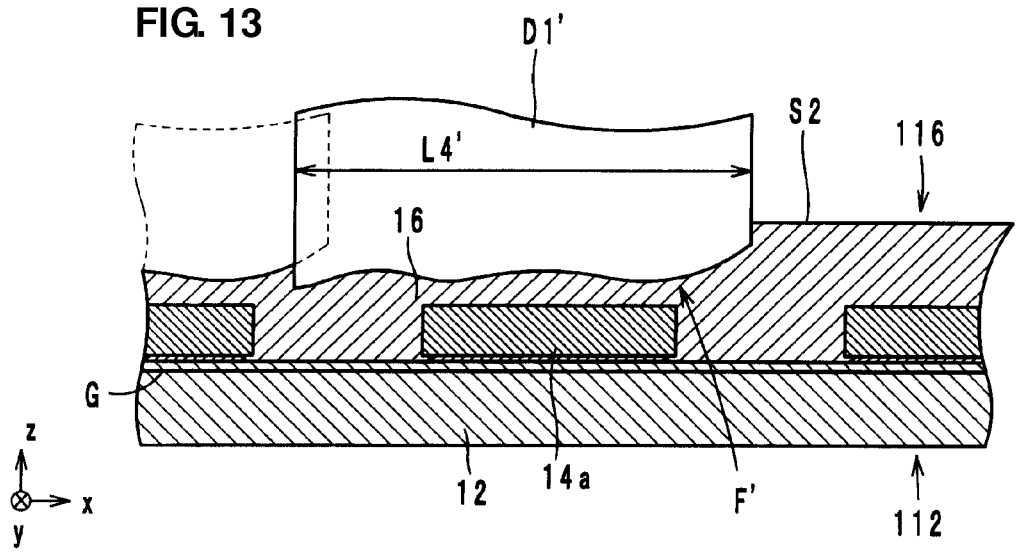
FIG. 13 is a sectional view illustrating a manufacturing step for the circuit module according to the modification.
Figure 14A:
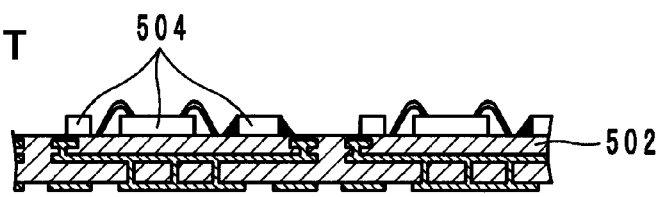
FIGS. 14A-14E include sectional views illustrating successively steps of a manufacturing method for a circuit module, which is disclosed in Japanese Unexamined Patent Application Publication No. 2008-42152.
Figure 14B:
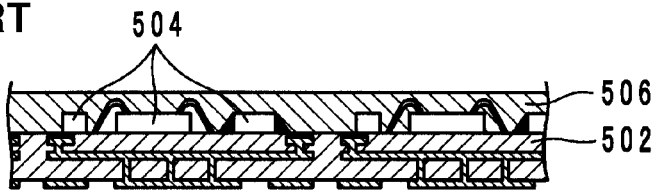
Figure 14C:
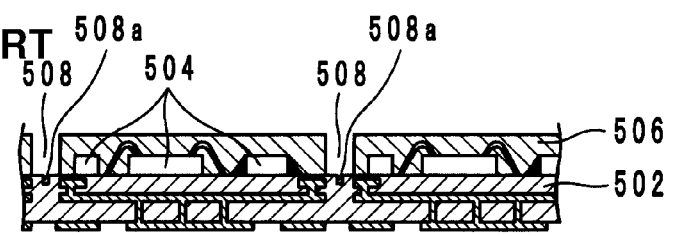
Figure 14D:
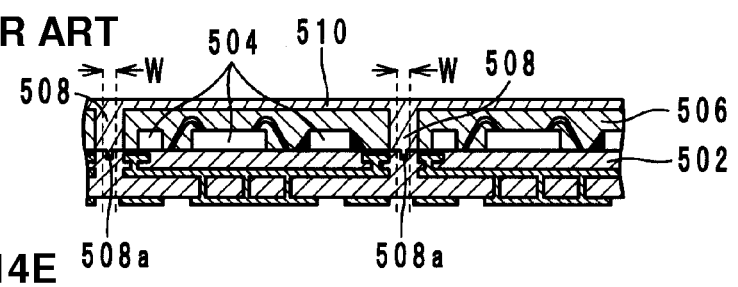
Figure 14E:
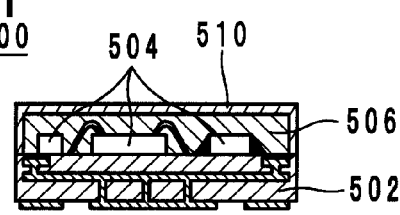

A circuit module and a manufacturing method for the same, according to a modification, will be described below with reference to the drawings. FIG. 12 is a sectional view illustrating the structure of a circuit module 10a according to the modification. FIG. 13 is a sectional view illustrating a manufacturing step for the circuit module 10a according to the modification.

The circuit module 10a differs from the circuit module 10 in shape of the unevenness that is created in the principal surface S2 of the insulator layer 16. This is because a dicer D1' used in the manufacturing method for the circuit module 10a differs from the dicer D1 used in the manufacturing method for the circuit module 10. The following description is made primarily about such a difference.

As seen from FIGS. 2 and 12, the principal surface S2 of the insulator layer 16 in the circuit module 10a has gentler unevenness than the principal surface S2 of the insulator layer in the circuit module 10. The reason is that, in the manufacturing method for the circuit module 10a, a comparatively large dicer suitable for cutting metals is used as the dicer D1'. More specifically, because the dicer D1' is a dicer suitable for cutting metals, it has higher hardness than the dicer D1. Therefore, the dicer D1' is less apt to wear than the dicer D1 and has a shape not including the projected portion F1 and the recessed portion F2 of the dicer D1. Instead, the dicer D1' has a comparatively rough cutting surface F' even in a not-worn state. In the manufacturing method for the circuit module 10a, unevenness (in the form of grooves 120 and projections 122) is created in the principal surface S2 of the insulator layer 116 by utilizing the cutting surface F'. Consequently, gentler unevenness than that in the principal surface S2 of the insulator layer 16 in the circuit module 10 can be obtained in the principal surface S2 of the insulator layer 16 in the circuit module 10a.

According to the above-described circuit module 10a and manufacturing method for the same, the unevenness in the principal surface S2 of the insulator layer 16 becomes gentler, and hence the unevenness in the principal surface S2 can be more easily compensated with the shield layer 18. As a result, the principal surface S3 of the shield layer 18 is flattened. Thus, even when the comparatively large dicer D1' is used, the unevenness can be created in the principal surface of the insulator layer 16 and the generation of the defect area where the electrically conductive resin is not coated can be suppressed by using the dicer D1' that has a rough surface.

In the manufacturing method for the circuit module 10, the principal surface S2 of the insulator layer 116 may also be cut by using a dicer D1 having a flat cutting surface F. In that case, however, a depth of cutting of the dicer D1 against the insulator layer 116 needs to be changed in order to create the unevenness in the principal surface S2 of the insulator layer 116.

Various preferred embodiments of the present invention are preferably applied to the circuit module and the manufacturing method for the same. In particular, the present invention is advantageous in reducing a possibility that the defect area where the electrically conductive resin is not coated may occur in the shield layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A circuit module comprising:
   a board;
   a plurality of electronic components mounted on a principal surface of the board;
   an insulator layer covering the principal surface of the board and the electronic components, the insulator layer including uneven portions in an upper principal surface thereof; and
   a shield layer disposed on the upper principal surface of the insulator layer, on lateral surfaces of the insulator layer located on opposite ends of the upper principal surface of the insulator layer, and on lateral surfaces of the board located on opposite ends of the principal surface of the board that correspond to the opposite ends of the upper principal surface of the insulator layer, and being made of an electrically conductive resin; wherein
   the uneven portions are defined by:
      at least one groove provided in the upper principal surface of the insulator layer and extending towards a lower principal surface of the insulator layer but not entirely through the insulating layer to the lower principal surface; and
      at least one projection provided in the upper principal surface of the insulator layer and extending away from the lower principal surface of the insulator layer; and
   at least one of the at least one groove and at least one of the at least one projection are disposed directly over at least one of the plurality of electronic components.

2. The circuit module according to claim 1, wherein a plurality of the grooves and a plurality of the projections are provided and arranged at predetermined intervals.

3. The circuit module according to claim 1, wherein a principal surface of the shield layer includes uneven portions that is in conformity with the uneven portions in the principal surface of the insulator layer.

4. The circuit module according to claim 1, wherein at least one of the lateral surfaces of the board includes a step provided therein, and the shield layer is disposed on the step of the at least one of the lateral surfaces of the board.

* * * * *